(12) United States Patent
Shimada et al.

(10) Patent No.: US 8,158,311 B2
(45) Date of Patent: Apr. 17, 2012

(54) METHOD FOR MANAGING LIGHT EXPOSURE MASK AND LIGHT EXPOSURE MASK

(75) Inventors: Shu Shimada, Tokyo (JP); Hideki Yamamoto, Tokyo (JP); Akihiko Naitoh, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 373 days.

(21) Appl. No.: 11/838,974

(22) Filed: Aug. 15, 2007

(65) Prior Publication Data
US 2008/0102381 A1    May 1, 2008

(30) Foreign Application Priority Data

Aug. 22, 2006 (JP) ................. 2006-225467

(51) Int. Cl.
G03C 5/00 (2006.01)
G03F 1/00 (2012.01)
C23G 1/02 (2006.01)
(52) U.S. Cl. .................. 430/30; 430/5; 134/3
(58) Field of Classification Search ............... 430/5, 30; 134/3
See application file for complete search history.

(56) References Cited

U.S. PATENT DOCUMENTS
2006/0019177 A1    1/2006  Mori et al.

FOREIGN PATENT DOCUMENTS
EP          1341042       9/2003
JP       2004-053817      2/2004
(Continued)

OTHER PUBLICATIONS

Hitoshi Habuka, Yohei Shimazaki, Shigeru Okamura, Fumitoshi Sugimoto, Takashi Takeuchi, Masahiko Aihara, Manabu Shimada and Kikuo Okuyama, "Time-Dependent Airborne Organic Contamination on Silicon Wafer Surface Stored in a Plastic Box," Jpn. J. Appl. Phys. 42 (2003) 1575.*

(Continued)

*Primary Examiner* — Mark F Huff
*Assistant Examiner* — Jonathan Jelsma
(74) *Attorney, Agent, or Firm* — Ladas & Parry LLP

(57) ABSTRACT

An object of the present invention is to provide a method for managing a light exposure mask wherein: a mask inspection or a wafer inspection, in order to manage a contamination of a light exposure mask by a growing foreign matter, is not necessary; the method has general versatility regardless to the history of the mask; the method dose not increase time and cost for mask manufacturing and inspection; and the method is operated so that the mask can always be used in a clean state. Another object of the present invention is to provide a light exposure mask wherein a contamination by a growing foreign matter dose not occur. A method for managing a light exposure mask is characterized in that: calculating a sulfate ion adsorption amount on a surface of the light exposure mask, of after a elapse of a predetermined time, from a sulfate ion concentration actually measured in an environment of using the light exposure mask, a maximum amount of sulfate ions adsorbed on the surface of the light exposure mask, and a threshold value of an amount of sulfate ions present on the surface of the light exposure mask of which the foreign matter occurs on the surface of the light exposure mask; setting an usable period of the light exposure mask, which the foreign matter dose not occur; and using the light exposure mask while rewashing the light exposure mask before the usable period expires.

3 Claims, 3 Drawing Sheets

FOREIGN PATENT DOCUMENTS

| | | |
|---|---|---|
| JP | 2005-308896 | 11/2005 |
| JP | 2006-011048 | 1/2006 |

OTHER PUBLICATIONS

Kaustuve Bhattacharyya et al; "Investigation of reticle defect formation at DUV lighography;" 2003 Proceedings IEEE/Semi Advanced Semiconductor Manufacturing Conference and Workshop. (ASMC). Munich Germany Mar. 31-Apr. 1, 2003, IEEE/Semi Advanced Semiconductor Manufacturing Conference and Workshop, New York NY: IEEE, US.

Brian J. Grenon et al; "Reticle Surface Contaminants and Their Relationship to Sub-pellicle Defect Formation;" Proceedings of the SPIE—The International Society for Optical Engineering SPIE—Int. Soc Opt. Eng Use, vol. 5375 No. 1, May 24, 2004, pp. 355-362.

Rainer Schmid et al; "Evaluation of printability of crystal growth defects in a 193nm lithography environment using AIMS;" Proceedings of the SPIE—The International Society for Optical Engineering SPIE—Int. Soc. Opt. Eng USA, vol. 5567, No. 1, 2004, pp. 1035-1043.

* cited by examiner

METHOD FOR MANAGING LIGHT EXPOSURE MASK AND LIGHT EXPOSURE MASK

BACKGROUND OF THE INVENTION

1. Field of the Invention

The present invention relates to a method for managing a light exposure mask (hereinafter, also referred to as "mask") which is used in a lithographic step of a semiconductor manufacturing process, and to a light exposure mask.

2. Description of the Related Art

As the fine structure and high integration of a LSI pattern progress in recent years, in a lithographic technology for use in pattern formation, a shorter wavelength is being used. For example, a light source of a light exposing apparatus such as g-ray (436 nm) and i-ray (365 nm) of a high pressure mercury arc lamp was conventionally used, but now, KrF excimer laser (248 nm) and ArF excimer laser (193 nm) are used. Because such an exposure light source emits light with a short wavelength and has a high output, the energy of the emitted light is high. Thus, this causes a phenomenon that a foreign matter, which grows with the elapse of time, occurs on a mask used for light exposure so that the mask is contaminated. It is reported that this growing foreign matter (which is also referred to "Haze" or "clouding") occurs remarkably as the wavelength of an exposure light is shorter. When the growing foreign matter occurs on the mask get larger to such an extent that the foreign matter is transferred to a wafer, it causes break or short circuit in a circuit of a semiconductor device.

As one of the major factors of occurrence of the foreign matter, which contaminates the light exposure mask when the light source with a short wavelength exposure light is used, it is reported as follows. A sulfate ion, which is an acidic substance used for mask washing and remains on a mask surface after mask manufacturing, and a basic substance such as ammonia, which is present under a mask usage environment, are reacted by irradiation with an excimer laser during pattern transfer so that ammonium sulfate or the like occurs as a foreign matter (for example, see Japanese Patent Application Laid-Open (JP-A) Nos. 2006-11048 and 2004-53817).

For this reason, there is a problem that, although a mask has a good quality with no defect in inspection after mask manufacturing, a foreign matter occurs on the mask to contaminate the mask during repetition of excimer laser irradiation in a light exposure apparatus. Whereby, a good pattern transfer image cannot be obtained on a wafer. In particular, there is a problem that a foreign matter, occurs on a transparent region or a semi-transparent region on the mask, changes the transmittance of exposure light. In some cases, although a mask is in a good state at the beginning of use, a foreign matter may grow as a contaminant with the elapse of time. Further, a foreign matter may occur on a certain mask even when the light exposure amount is small. These cases are difficult problems in management of a mask.

Regarding the above-mentioned problems of the growing foreign matter which contaminates a mask, as a method for managing a light exposure mask, there are proposed, for example: a method of rewashing a mask at every time when an accumulated light exposure amount (accumulated irradiation amount) becomes a predetermined value; a method of rewashing a mask in a case of observing a foreign matter in inspection of the mask at every predetermined value of an accumulated irradiation amount; a method of providing a foreign matter evaluation portion on a mask and evaluating a usage limit of the mask (for example, see JP-A-2005-308896); and a method of rewashing a mask in a case of observing a defect common to chips on a wafer surface, in inspection of every predetermined lots of light-exposed wafers.

However, the above-described managing method using an accumulated irradiation amount has its disadvantage as follows. Although masks have the same quality regarding a remaining component on a substrate, the occurrence frequency of a foreign matter is different among the masks depending on the usage environment of the mask and the like. Therefore in some cases, failure occurs on a wafer before the accumulated irradiation amount becomes a predetermined value. When the frequency of mask washing is increased in order to prevent such a failure from occurring, there is a problem of increasing manufacturing time and cost. The managing method of combining the accumulated irradiation amount with mask inspection has a problem that even though the failure is prevented from occurring, the inspection is weighted to cause increased costs depending on increase in inspection time. The managing method of providing a growing foreign matter evaluation portion on a mask is a restrictive method only used for a specific mask and has no general versatility. The managing method of inspecting a wafer includes a destructive inspection, and therefore there is a problem of causing a plurality of wafer chip defect failures.

SUMMARY OF THE INVENTION

Therefore, the present invention has been accomplished in view of the above-described problems. That is, an object of the present invention is to provide a method for managing a light exposure mask wherein: a mask inspection or a wafer inspection, in order to manage a contamination of a light exposure mask by a growing foreign matter, is not necessary; the method has general versatility and high reliability regardless to the history of the mask; the method does not increase time and cost for mask manufacturing and inspection; and the method is operated so that the mask can always be used in a clean state. Another object of the present invention is to provide a light exposure mask wherein contamination by a growing foreign matter does not occur.

In order to solve the above-described problems, in an aspect, the present invention provides a method for managing a light exposure mask, wherein the light exposure mask contaminated by a sulfate ion-based foreign matter is rewashed and used by: calculating a sulfate ion adsorption amount on a surface of the light exposure mask, of after a elapse of a predetermined time, from a sulfate ion concentration actually measured in an environment of using the light exposure mask, a maximum amount of sulfate ions adsorbed on the surface of the light exposure mask, and a threshold value of an amount of sulfate ions present on the surface of the light exposure mask of which the foreign matter occurs on the surface of the light exposure mask; setting an usable period of the light exposure mask, which the foreign matter does not occur; and using the light exposure mask while rewashing the light exposure mask before the usable period expires.

In other aspect, the method for managing a light exposure is characterized in that, when the sulfate ion concentration in the environment is /defined as $C_{sulf}(\mu g/m^3)$ the maximum amount of sulfate ions adsorbed on the light exposure mask is defined as $M_{max}$ (ng/cm$^2$), the amount of sulfate ions adsorbed on the surface of the light exposure mask, of after a elapse of a predetermined time (t), is defined as $M_{sulf}$ (ng/cm$^2$), and A and B are constants, the sulfate ion adsorption amount $M_{sulf}$ satisfies the following relational expression:

$$M_{sulf} = M_{max} - A \times \exp(-B \times C_{sulf} \times t).$$

In other aspect, the method for managing a light exposure is characterized in that, wherein the light exposure mask is a mask for use in a light exposure apparatus including an ArF excimer laser as an exposure light source, and the threshold value of an amount of sulfate ions present on the surface of the light exposure mask, of which the foreign matter occurs on the surface of the light exposure mask, is 1 ng/cm$^2$ or more.

In other aspect, the method for managing a light exposure is characterized in that the light exposure mask is a mask for use in a light exposure apparatus including an KrF excimer laser as an exposure light source, and the threshold value of an amount of sulfate ions present on the surface of the light exposure mask, of which the foreign matter occurs on the surface of the light exposure mask, is 5 ng/cm$^2$ or more.

In other aspect, the method for managing a light exposure is characterized in that the sulfate ion concentration actually measured in the environment and the sulfate ion adsorption amount are values measured by an ion chromatographic method.

In other aspect, the present invention provides a light exposure mask comprising a mask pattern formed on a transparent substrate, wherein the light exposure mask is used for a light exposure apparatus including an ArF excimer laser as an exposure light source, and an amount of sulfate ions present on the surface of the light exposure mask, at least on a side where the mask pattern is formed, is less than 1 ng/cm$^2$.

In other aspect, the present invention provides a light exposure mask comprising a mask pattern formed on a transparent substrate, wherein the light exposure mask is used for a light exposure apparatus including an KrF excimer laser as an exposure light source, and an amount of sulfate ions present on the surface of the light exposure mask, at least on a side where the mask pattern is formed, is less than 5 ng/cm$^2$.

In the method for managing a light exposure mask according to the present invention, by setting a usable period of the light exposure mask, which the foreign matter does not occur; a mask inspection or a wafer inspection, in order to manage a contamination of a light exposure mask by a sulfate ion-based growing foreign matter, is not necessary; the method has general versatility and high reliability regardless to the history of the mask; the method does not increase time and cost for mask manufacturing and inspection; and the mask can always be used in a clean state so that wafer defects can be prevented. The method for managing a light exposure mask according to the invention makes it possible to prolong a mask lifetime before rewashing of the mask by suppressing an amount of sulfate ions adsorbed on the light exposure mask and improving the usage environment of the light exposure mask.

In a case of using the mask of the present invention for a light exposure apparatus having an ArF excimer laser or KrF excimer laser as an exposure light source, since contamination by sulfate ion-based growing foreign matter does not occur on the mask, transfer of a mask pattern with good quality is possible.

DESCRIPTION OF THE PREFERRED EMBODIMENTS (Method of Managing Light Exposure Mask)

As the results of various tests, the present inventors have found that: a growing foreign matter on the surface of a light exposure mask is formed by reaction of an acid-based ion such as a sulfate ion and an alkaline ion such as an ammonium ion; among these ions, there are many foreign matters caused by a sulfate ion; and in occurrence of the sulfate ion-based growing foreign matter on the mask surface, there is a threshold value of the sulfate ion amount on the mask surface. From these findings, the present inventors have obtained the conditions that the light exposure mask is not contaminated, whereby the present invention has been accomplished.

Namely, as described above, the method of the present invention is a method for managing a light exposure mask, wherein the light exposure mask contaminated by a sulfate ion-based foreign matter is rewashed and used by: calculating a sulfate ion adsorption amount on a surface of the light exposure mask, of after a elapse of a predetermined time (hereinafter, also referred to as "sulfate ion amount"), from a sulfate ion concentration actually measured in an environment of using the light exposure mask, a maximum amount of sulfate ions adsorbed on the surface of the light exposure mask, and a threshold value of an amount of sulfate ions present on the surface of the light exposure mask of which the foreign matter occurs on the surface of the light exposure mask; setting an usable period of the light exposure mask, which the foreign matter does not occur; and using the light exposure mask while rewashing the light exposure mask before the usable period expires.

With reference to the drawings, an embodiment of a method for managing a light exposure mask according to the present invention will be explained by taking a case of using an ArF excimer laser as an exposure light source, as an example.

(Threshold Value of Sulfate Ion Amount on Mask Surface)

Figure 1:
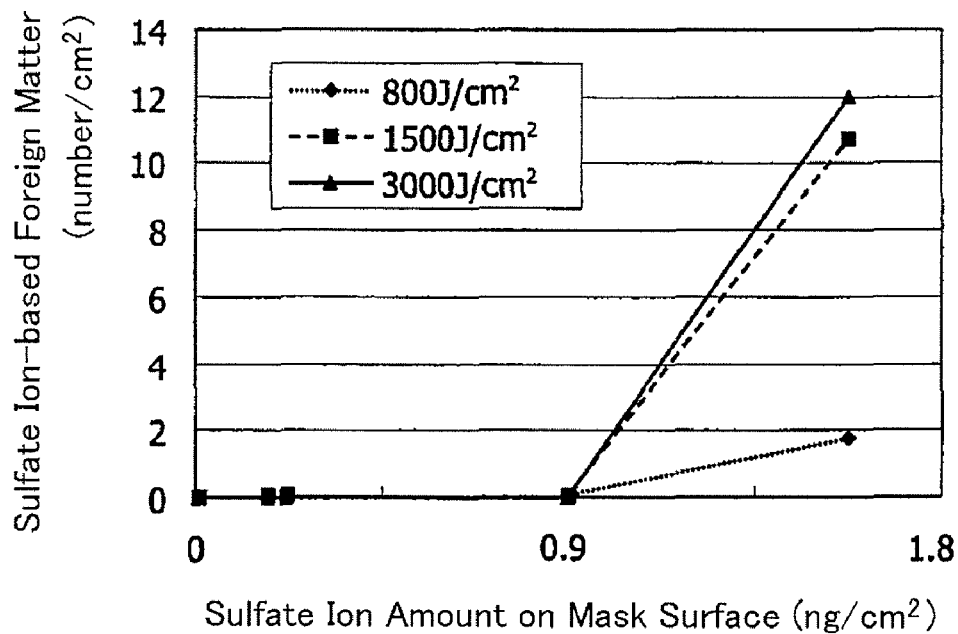
FIG. 1 is a graph showing a relationship between a sulfate ion amount on the surface of a light exposure mask and an occurred number of a sulfate ion-based foreign matter in a case of varying a light exposure amount of an ArF excimer laser.

FIG. 1 shows a relationship between a sulfate ion amount on the surface of a light exposure mask (horizontal axis) and an occurred number of a sulfate ion-based foreign matter (vertical axis) in a case of varying the accumulated light exposure amount from 800 J/cm$^2$ to 3000 J/cm$^2$ using an ArF excimer laser as an exposure light source. The measurement of the sulfate ion amount on the surface of the light exposure mask can be obtained by: extracting ions present on the surface of the light exposure mask, that are the object of the measurement, with pure water; and quantitatively analyzing the ion-extracted pure aqueous solution by using an ion chromatographic method. In this case, it is preferable to extract the ions by boiling the pure water.

A quantitative value ppb (=ng/ml) of sulfate ions on the mask surface obtained by the ion chromatographic method shows a sulfate ion concentration in pure water in which the mask is immersed. Therefore, in the present invention, the sulfate ion concentration is converted to ng/cm² which is more common unit as the sulfate ion amount on the mask. The conversion equation of the sulfate ion concentration ppb on the mask to the sulfate ion amount ng/cm² is 1 ppb=0.22 ng/cm² when the extracted liquid amount is 100 ml and the surface area of the mask is 450 cm².

As shown in FIG. 1, in a case where the sulfate ion amount on the surface of the light exposure mask is less than 1 ng/cm², the sulfate ion-based foreign matter does not occur regardless of the light exposure amount, that is, respective accumulated light exposure amount of 800 J/cm², 1,500 J/cm² and 3,000 J/cm². However, when the sulfate ion amount on the surface of the light exposure mask exceeds 1 ng/cm², the sulfate ion-based foreign matter occurs regardless of the respective light exposure amounts. As clear from FIG. 1, there is a threshold value of the sulfate ion amount on the surface of the light exposure mask regarding occurrence of the sulfate ion-based foreign matter, and in a case of at least 1.1 ng/cm², 1/cm² or more of foreign matters have occurred.

Figure 2:
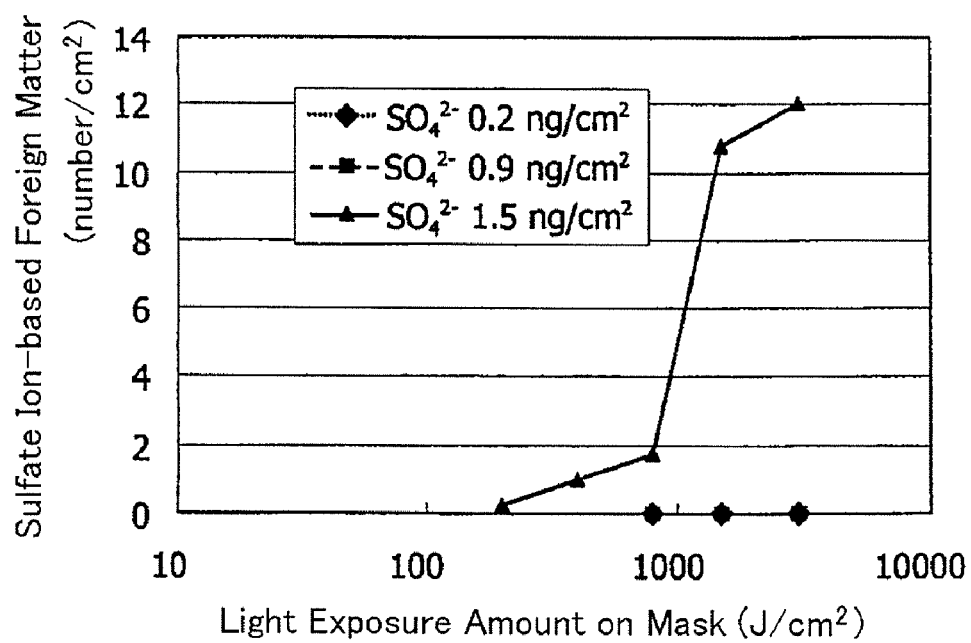
FIG. 2 is a graph showing a relationship between a light exposure amount on a wafer from the ArF excimer laser and an occurred number of the sulfate ion-based foreign matter in a case of varying the sulfate ion amount on the surface of the light exposure mask.

FIG. 2 shows a relationship between the accumulated light exposure amount by the ArF excimer laser (horizontal axis) and an occurred number of the sulfate ion-based foreign matter on the surface of the light exposure mask (vertical axis) in a case of varying the sulfate ion amount on the surface of the light exposure mask from 0.2 ng/cm² to 1.5 ng/cm². For the accumulated light exposure amount, a value obtained by measuring on the mask is used.

As shown in FIG. 2, in a case where the sulfate ion amount on the surface of the light exposure mask is 0.2 ng/cm² and 0.9 ng/cm², the sulfate ion-based foreign matter does not occur even at the accumulated light exposure amount exceeding 1,000 J/cm². However, when the sulfate ion amount on the surface of the light exposure mask is 1.5 ng/cm², the sulfate ion-based foreign matter occurs even at a low light exposure amount of immediately exceeding 100 J/cm².

Accordingly, as shown in FIGS. 1 and 2, the threshold value of the sulfate ion amount on the surface of the mask, of which the sulfate ion-based foreign matter occurs, is set to 1 ng/cm² or more in the case of using the ArF excimer laser in the present invention. As described above, in a case where the sulfate ion amount on the surface of the mask is 1 ng/cm² or more, which is the threshold value, the sulfate ion-based foreign matter occurs even at a very low accumulated light exposure amount.

Incidentally, in a usual washing of a light exposure mask, the amount of sulfate ions remaining on the mask surface after washing is around 0.4 ng/cm².

In the occurrence of the sulfate ion-based foreign matter on the surface of the light exposure mask, the sulfate ion concentration present in the usage environment of the mask, as well as the sulfate ion remaining on the mask surface after washing, become major factors.

The present inventors analyzed the sulfate ion concentration present in the environment by using the following equation (1) of H. Habuka et al. obtained by improving Langumuir's adsorption equation (H. Habuka et al, Jpn. J. Appl. Phys. 42, 1575 (2003)):

$$dS/dt = (S_{max} - S)k_{ad,i}C_i - k_{de,i}S \quad (1)$$

wherein: "t" denotes time (hour); "S" denotes a surface concentration of "i" species; $S_{max}$ denotes a maximum surface concentration; $C_i$ denotes a concentration of "i" species in the environment (g/cm³); $k_{ad}$ denotes an adsorption rate of "i" species onto the mask surface (ng/cm²/h); and $k_{de,i}$ denotes a release rate of "i" species from the mask surface (ng/cm²/h).

Here, when "i"=$SO_4^{2-}$, on the assumption that a sulfate ion once adsorbed on the mask surface could not be released from the mask surface ($k_{de,\ sulf}$=0), the following equation (2) was obtained by integrating the above equation (1):

$$M_{sulf} = M_{max} - A \times \exp(-B \times C_{sulf} \times t) \quad (2)$$

wherein: $M_{sulf}$ denotes an amount of sulfate ions adsorbed after the elapse of a predetermined time "t" (ng/cm²); $M_{max}$ denotes a maximum sulfate ion adsorption amount (ng/cm²); A and B are constants; and $C_{sulf}$ denotes sulfate ion concentration in the environment (μ/m³).

From experiments, the present inventors obtained the relationship among the elapsed time "t", the sulfate ion concentration in the environment $C_{sulf}$ and the sulfate ion adsorption amount $M_{sulf}$ shown in Table 1. Subsequently, the constants A and B were obtained from the results of Table 1, and the maximum sulfate ion adsorption amount $M_{max}$ was calculated, simulating the case of a glass substrate for mask blanks, on the assumption that $M_{max}$=10 ng/cm².

The sulfate ion concentration in the environment was measured by an environment analyzer CM505 (manufactured by Yokogawa Electric Corporation) using an ion chromatographic method. The sulfate ion adsorption amount was obtained by immersing a glass substrate after adsorption into 100 ml of warm pure water and measuring the warm pure water with ion chromatography.

TABLE 1

| t (hour) | Csulf (μg/m³) | Msulf (ng/cm²) |
|---|---|---|
| 3 | 0.6 | 0.01 |
| 12 | 0.6 | 0.02 |
| 168 | 0.6 | 0.17 |

From the above results, in a case where the actually measured sulfate ion concentration in the environment $C_{sulf}$ showed a specified value, the above equation (2) was calculated to obtain the time dependency of the sulfate ion adsorption amount $M_{sulf}$. The cases wherein the sulfate ion concentration in the environment $C_{sulf}$ is: 0.4 μg/m³; and 0.04 μg/m³ will be exemplified below.

Figure 3:
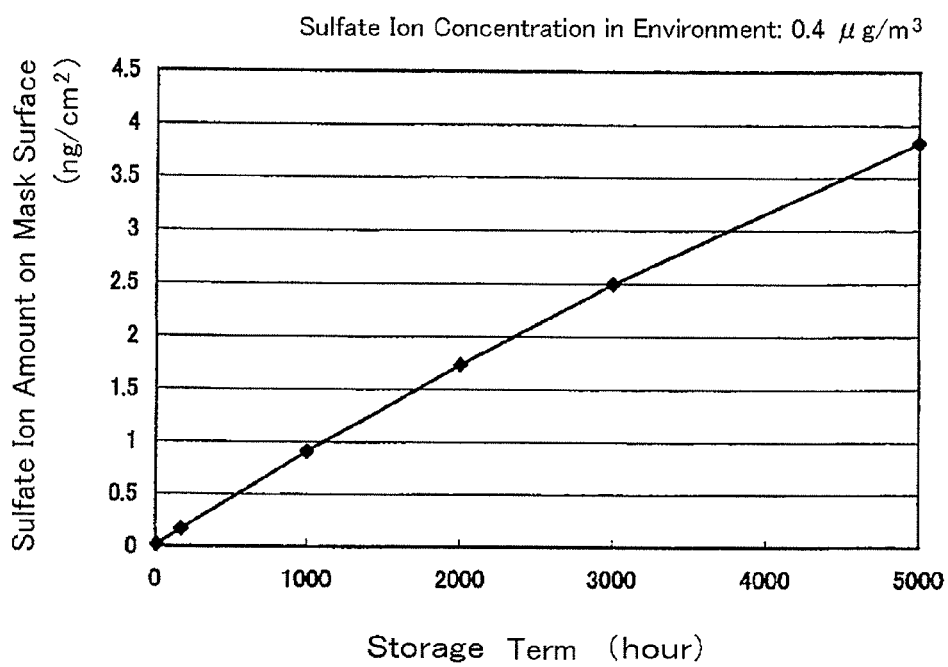
FIG. 3 is a graph showing a relationship between a storage time and an amount of sulfate ions adsorbed on the surface of the mask in a case where the sulfate ion concentration in an environment is 0.4 μg/m$^3$.

FIG. 3 shows a relationship between the storage time of the light exposure mask and the sulfate ion adsorption amount $M_{sulf}$ on the mask surface, in a case where the sulfate ion concentration in the environment $C_{sulf}$ is 0.4 μg/m³. After the elapse of 1500 hours (about 63 days), when the maximum sulfate ion adsorption amount $M_{max}$ is 10 ng/cm², it is estimated that sulfate ions of 1 ng/cm² would be adsorbed. Here, the storage time of the light exposure mask includes the time of using the mask.

The sulfate ion concentration in the environment can be measured as follows: a glass substrate for mask blanks having a washed clean surface is left in an environment for a predetermined time; ions adsorbed on the surface of the glass substrate for mask blanks are extracted by pure water with heating; and the ion-extracted pure water solution is quantitatively analyzed by using an ion chromatographic method.

Figure 4:
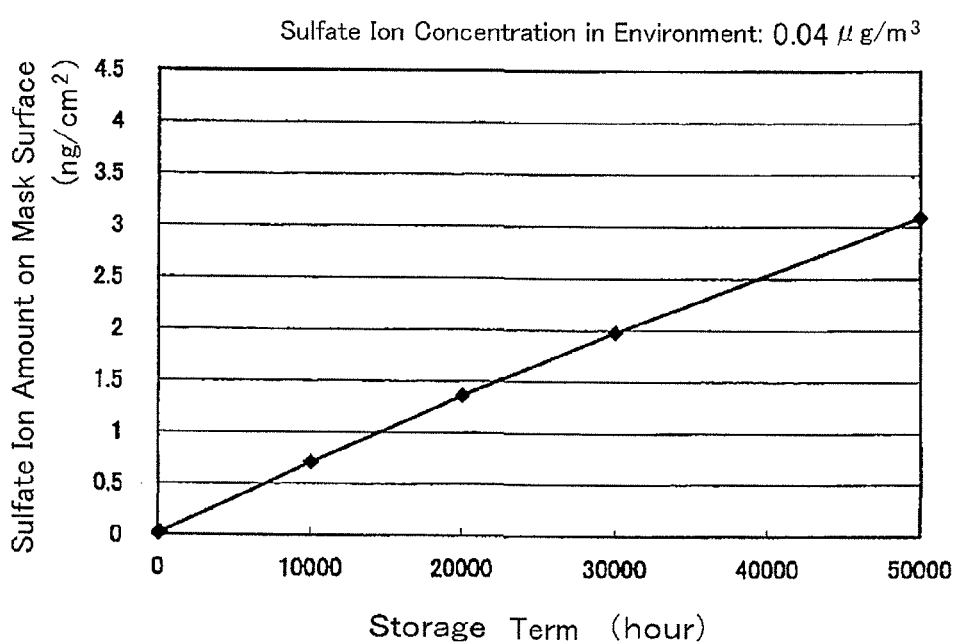
FIG. 4 is a graph showing a relationship between a storage time and an amount of sulfate ions adsorbed on the surface of the mask in a case where the sulfate ion concentration in an environment is 0.04 μg/m$^3$.

FIG. 4 shows a relationship between the storage time of the light exposure mask and the sulfate ion amount adsorbed on the mask surface $M_{sulf}$, in a case where the sulfate ion concentration in the environment $C_{sulf}$ is 0.04 μg/m³. After the elapse of 15000 hours (625 days), it is estimated that sulfate ions of 1 ng/cm² would be adsorbed. As clear from FIGS. 3 and 4, if the sulfate ion concentration in the environment is reduced to 1/10, the time until the equivalent amount of sulfate ions are adsorbed to the surface of the mask would be ten times longer. Thus, regarding the influence of the sulfate ion concentration in the environment, a mask lifetime until rewashing is required is prolonged by ten times.

As described above, from actual measurement of the sulfate ion concentration in the environment $C_{sulf}$ and the elapse time of storage in the environment, it is possible to calculate the sulfate ion adsorption amount on the surface of the light exposure mask $M_{sulf}$ during the elapse time. Further, it is possible to estimate the timing when the sulfate ion-based foreign matter occurs on the surface of the light exposure mask, from the threshold value of the sulfate ion amount on the mask surface of which the sulfate ion-based foreign matter occurs.

Figure 5:
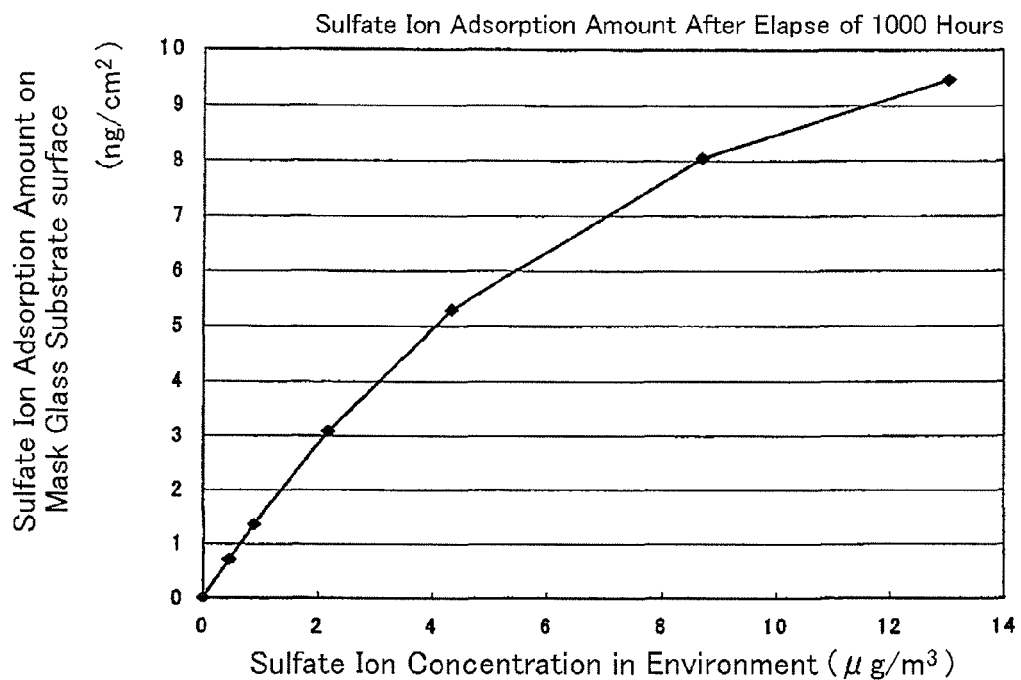
FIG. 5 is a graph showing an amount of sulfate ions adsorbed on a substrate surface in a case of storing a glass substrate for mask blanks, for 1000 hours, under respective environments having different sulfate ion concentrations.

For example, FIG. 5 is a graph showing the sulfate ion amount adsorbed on the substrate surface $M_{sulf}$ in a case of storing a glass substrate for mask blanks for 1000 hours in respective environments having different sulfate ion concentrations $C_{sulf}$. For the substrate for the mask, for example, a glass substrate for mask blanks, which might be most affected by contamination by the foreign matter, was used.

As shown in FIG. 5, under the condition of the sulfate ion concentration in the environment $C_{sulf}$ being 13 µg/m$^3$, the sulfate ion amount on the surface of the glass substrate for mask blanks $M_{sulf}$ becomes saturated after the elapse of 1000 hours. On the other hand, under the condition of the sulfate ion concentration in the environment $C_{sulf}$ being 0.7 µg/m$^3$, it is estimated that 1 ng/cm$^2$ of sulfate ions are adsorbed after the elapse of 1000 hours.

Figure 6:
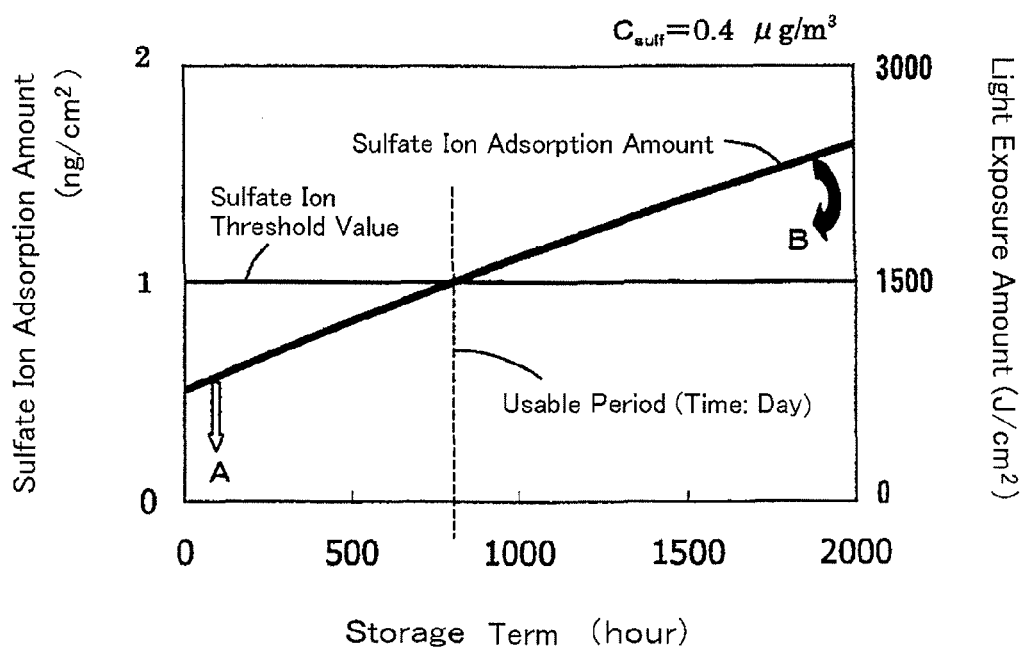
FIG. 6 is a graph illustrating one example of a method for managing a light exposure mask in the present invention.

FIG. 6 is a graph for illustrating one example of the method for managing the light exposure mask according to the present invention. The horizontal axis of FIG. 6 indicates the storage term (time: hour) in the storage environment of the light exposure mask; the left vertical axis indicates the sulfate ion amount adsorbed on the light exposure mask $M_{sulf}$ (ng/cm$^2$); and the right vertical axis indicates the light exposure amount (J/cm$^2$). The sulfate ion concentration in the environment $C_{sulf}$ actually measured by the ion chromatographic method, is 0.4 µg/m$^3$. The amount of sulfate ions adsorbed on the surface of the light exposure mask after the elapse of a predetermined time (ng/cm$^2$) is shown by a bold line. The threshold value of the amount of sulfate ions present on the surface of the light exposure mask, of which the foreign matter occurs, as described above, is 1 ng/cm$^2$ (thin line). The intersection of two lines indicates a usable period (represented by a broken line) and is set as the usable period (time: day).

In FIG. 6, even when the accumulated light exposure amount is a large value, the sulfate ion-based foreign matter does not occur within the usable period. On the other hand, even when the accumulated light exposure amount is a small value, there is a fear of occurrence of the sulfate ion-based foreign matter when the usable period expires. Accordingly, before expiring the usable period, the light exposure mask is rewashed, and the mask is returned to an initial clean state and used again. By repeating such a cycle, it becomes possible to prevent the occurrence of a defective wafer due to the growing foreign matter on the light exposure mask.

In order to prolong the lifetime (storage term) of the light exposure mask until the mask is rewashed, it suffices that in FIG. 6, the bold line indicating the sulfate ion adsorption amount on the surface of the light exposure mask $M_{sulf}$ is lowered (as the direction "A" indicated by an outline arrow), or the slope of the bold line is made smaller (as the direction "B" indicated by a black solid arrow). The former means the decrease of the amount of sulfate ions remaining on the mask surface when the light exposure mask is washed. The latter means the decrease of the sulfate ion concentration in the storage environment of the light exposure mask.

An example of the latter is as follow. In a case where the sulfate ion concentration in the storage environment of the mask is 0.4 µg/m$^3$ and the usable period is 48 days, the usable period can be prolonged to 365 days by decreasing the sulfate ion concentration in the environment to 0.06 µg/m$^3$.

As described above, in the method for managing a light exposure mask according to the present invention: a mask inspection or a wafer inspection is not necessary; the method has general versatility regardless to the history of the mask; the method does not increase time and cost for mask manufacturing and inspection; the mask can always be used in a clean state; and it is possible to prevent occurrence of defects on the wafer. Further, the method for managing the light exposure mask according to the present invention makes it possible to prolong the usable period until the mask is rewashed so as to prolong a mask lifetime by suppressing the amount of sulfate ions adsorbed on the light exposure mask and improving the storage environment of the light exposure mask.

The above description has been made with respect to the case where the light exposure mask is applied to a light exposure apparatus including an ArF excimer laser as an exposure light source. In a case where the light exposure mask is applied to a light exposure apparatus including a KrF excimer laser as an exposure light source, a threshold value of the amount of sulfate ions present on the surface of the light exposure mask, of which the foreign matter occurs, is 5 ng/cm$^2$ or more. Accordingly, the management value is preferably less than 5 ng/cm$^2$. Since the case of the KrF excimer laser is the same as the case of the ArF excimer laser in adsorption behavior of sulfate ions on the mask surface, the same adsorption equation in the ArF excimer laser is used in the case of the KrF excimer laser.

(Light Exposure Mask)

In the light exposure mask according to the present invention, a mask pattern is formed on a transparent substrate. In a case where the mask is used for a light exposure apparatus including an ArF excimer laser as an exposure light source, the sulfate ion amount on the surface of the mask for ArF excimer laser light exposure, at least on a side where the mask pattern is formed, is set to a value less than 1 ng/cm$^2$. As described above, in a case where the sulfate ion amount on the mask surface is 1 ng/cm$^2$ or more, the sulfate ion-based foreign matter occurs at a very small light exposure amount. On the contrary, by setting the sulfate ion concentration on the mask surface to a value less than 1 ng/cm$^2$, it is possible to use the mask for a long term while maintaining high quality without necessity of rewashing of the mask.

In the light exposure mask according to the present invention, a mask pattern is formed on a transparent substrate. In a case where the mask is used for a light exposure apparatus including an KrF excimer laser as an exposure light source, the sulfate ion amount on the surface of the mask for KrF excimer laser light exposure, at least on a side where the mask pattern is formed, is set to a value less than 5 ng/cm$^2$. As described above, in a case where the sulfate ion amount on the mask surface is 5 ng/cm$^2$ or more, the sulfate ion-based foreign matter occurs at a very small light exposure amount. On the contrary, by setting the sulfate ion concentration on the mask surface to a value less than 5 ng/cm$^2$, it is possible to use the mask for a long term while maintaining high quality without necessity of rewashing of the mask.

As described above, the measurement of the sulfate ion concentration on the surface of the light exposure mask can be obtained by: extracting ions present on the surface of the light exposure mask, that are object of the measurement, with pure water; and quantitatively analyzing the ion-extracted pure aqueous solution by using an ion chromatographic method. In this case, it is preferable to extract the ions by heating the pure water to high temperature to an extent that the pure water is not boiled.

When a KrF excimer laser or ArF excimer laser, more preferably an ArF excimer laser is used as an exposure light source in a light exposure apparatus, particularly in a case of using exposure light having a short wavelength, the light exposure mask according to the present invention shows a larger effect. That is, it shows an effect that a mask pattern with high quality can be transferred by using the mask of the present invention as a light exposure mask of which the contamination, by the sulfate ion-based growing foreign matter, is not caused.

What is claimed is:

1. A method for managing a light exposure mask, wherein the light exposure mask contaminated by a sulfate ion-based foreign matter is rewashed and used by:
    calculating a sulfate ion adsorption amount on a surface of the light exposure mask, after a elapse of a predetermined time, from
        a sulfate ion concentration actually measured in an environment of using the light exposure mask,
        a maximum amount of sulfate ions adsorbed on the surface of the light exposure mask, and
        a threshold value of an amount of sulfate ions present on the surface of the light exposure mask of which the foreign matter occurs on the surface of the light exposure mask;
    setting an usable period of the light exposure mask, which the foreign matter does not occur; and
    using the light exposure mask while rewashing the light exposure mask before the usable period expires, and
    wherein the light exposure mask is a mask for use in a light exposure apparatus including an ArF excimer laser as an exposure light source, and
    the threshold value of an amount of sulfate Ions present on the surface of the light exposure mask, of which the foreign matter occurs on the surface of the light exposure mask, is 0.9 ng/cm$^2$.

2. The method for managing a light exposure mask according to claim 1, wherein, when the sulfate ion concentration in the environment is defined as $C_{sulf}$ (μg/m$^3$), the maximum amount of sulfate ions adsorbed on the light exposure mask is defined as $M_{max}$ (ng/cm$^2$), the amount of sulfate ions adsorbed on the surface of the light exposure mask, of after a elapse of a predetermined time (t), is defined as $M_{sulf}$ (ng/cm$^2$), and A and B are constants,
    the sulfate ion adsorption amount $M_{sulf}$ satisfies the following relational expression:

$$M_{sulf} = M_{max} - A \times \exp(-B \times C_{sulf} \times t).$$

3. The method for managing a light exposure mask according to claim 1, wherein the sulfate ion concentration actually measured in the environment and the sulfate ion adsorption amount are values measured by an ion chromatographic method.

* * * * *